(12) United States Patent
Akahane

(10) Patent No.: US 11,469,751 B2
(45) Date of Patent: Oct. 11, 2022

(54) DRIVE CIRCUIT, DRIVE METHOD, AND SEMICONDUCTOR SYSTEM

(71) Applicant: FUJI ELECTRIC CO., LTD., Kawasaki (JP)

(72) Inventor: Masashi Akahane, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 17/452,404

(22) Filed: Oct. 27, 2021

(65) Prior Publication Data
US 2022/0045671 A1    Feb. 10, 2022

Related U.S. Application Data

(60) Division of application No. 16/830,283, filed on Mar. 26, 2020, now Pat. No. 11,165,418, which is a (Continued)

(30) Foreign Application Priority Data

Apr. 3, 2018 (JP) .................................. 2018-071709

(51) Int. Cl.
*H03K 17/18* (2006.01)
*H03K 17/082* (2006.01)
(Continued)

(52) U.S. Cl.
CPC .......... *H03K 17/0822* (2013.01); *H02M 1/08* (2013.01); *H03K 17/18* (2013.01);
(Continued)

(58) Field of Classification Search
CPC .. H03K 17/0822; H03K 17/18; H03K 17/567; H03K 17/08; H03K 19/018521;
(Continued)

(56) References Cited

U.S. PATENT DOCUMENTS 5,543,994 A      8/1996 Wilhelm
10,224,922 B1 *  3/2019 Tiwari ........... H03K 19/018521
(Continued)

FOREIGN PATENT DOCUMENTS

JP    H08330929 A    12/1996
JP    2003032102 A    1/2003
(Continued)

OTHER PUBLICATIONS (ISA/237) Written Opinion of the International Search Authority for International Patent Application No. PCT/JP2019/007313, issued/mailed by the Japan Patent Office dated May 21, 2019.
(Continued)

*Primary Examiner* — Sibin Chen

(57) ABSTRACT

A drive circuit includes: a control section generating a control signal; a first level shift section raising a level of a signal from the control section; a high side drive section controlling a semiconductor device; and a second level shift section lowering a level of a signal from the high side drive section for input to the control section. The high side drive section has an error detection section maintaining an output of an error detection signal when the semiconductor device is in an error status until a release signal is input, the control section has an error handling section outputting the release signal to the high side drive section via the first level shift section when the error detection signal is input via the second level shift section, and the error detection section stops the output of the error detection signal when the release signal is input.

10 Claims, 9 Drawing Sheets

Related U.S. Application Data continuation of application No. PCT/JP2019/007313, filed on Feb. 26, 2019.

(51) Int. Cl.
*H02M 1/08* (2006.01)
*H03K 19/0185* (2006.01)

(52) U.S. Cl.
CPC ............. *H03K 19/018521* (2013.01); *H03K 2217/0063* (2013.01)

(58) Field of Classification Search
CPC ... H03K 2217/0063; H03K 2217/0072; H03K 2217/0081; H02M 1/08
See application file for complete search history.

(56) References Cited

U.S. PATENT DOCUMENTS

| | | |
|---|---|---|
| 2003/0012040 A1 | 1/2003 | Orita |
| 2008/0231321 A1 | 9/2008 | Herzer |
| 2018/0047328 A1* | 2/2018 | Kim ............... H03K 19/0175 |
| 2020/0051652 A1* | 2/2020 | Jeong ............... H02H 9/046 |
| 2020/0355745 A1* | 11/2020 | Bogus ............... H02H 7/0833 |

FOREIGN PATENT DOCUMENTS

| | | |
|---|---|---|
| JP | 2004304929 A | 10/2004 |
| JP | 2008199607 A | 8/2008 |
| JP | 2010062860 A | 3/2010 |
| JP | 2015159471 A | 9/2015 |

OTHER PUBLICATIONS

U.S. Appl. No. 16/830,283, filed Mar. 26, 2020, to Masashi Akahane.

* cited by examiner

DRIVE CIRCUIT, DRIVE METHOD, AND SEMICONDUCTOR SYSTEM

CROSS-REFERENCE TO RELATED APPLICATIONS

This application is a divisional of U.S. patent application Ser. No. 16/830,283, filed on Mar. 26, 2020, the entirety of which is incorporated herein by reference. The application also claims priority from the following Japanese patent applications, which are explicitly incorporated herein by reference:
No. 2018-071709, filed on Apr. 3, 2018, and
No. PCT/JP2019/007313, filed on Feb. 26, 2019.

BACKGROUND

1. Technical Field

The present invention relates to a drive circuit, a drive method, and a semiconductor system.

2. Related Art

In the related art, for a drive circuit of a semiconductor device such as a power semiconductor, a circuit including a circuit that detects an error such as an overcurrent is known (for example, see Patent Literatures 1 to 3).
[Patent Literature 1] Japanese Patent Application Publication No. H08-330929 (JP-H08-330929A)
[Patent Literature 2] Japanese Patent Application Publication No. 2010-62860 (JP-2010-62860A)
[Patent Literature 3] Japanese Patent Application Publication No. 2015-159471 (JP-2015-159471A)

The drive circuit has a low side control section that operates at a relatively low voltage, and a high side drive section that operates at a relatively high voltage. An error detection signal generated by the high side drive section is transmitted to the low side control section via a level shift circuit. In order to surely input the error detection signal to the low side control section, it is preferable that the high side drive section continue to output the error detection signal for a certain period. However, when the error detection signal is continuously output, power consumption in the level shift circuit increases.

In order to solve the above problem, a first aspect of the present invention provides a drive circuit of a semiconductor device. The drive circuit may include a control section that generates a control signal in accordance with an input signal. The drive circuit may include a first level shift section that raises a level of a signal from the control section. The drive circuit may include a high side drive section that controls the semiconductor device based on the control signal of which the level has been raised by the first level shift section. The drive circuit may include a second level shift section that lowers a level of a signal from the high side drive section for input to the control section. The high side drive section may have an error detection section that outputs an error detection signal when the semiconductor device is in an error status, and maintains the output of the error detection signal until a release signal is input. The control section may have an error handling section that outputs the release signal to the high side drive section via the first level shift section when the error detection signal is input via the second level shift section. The error detection section may stop the output of the error detection signal when the release signal is input.

The high side drive section may have a drive control section that drives the semiconductor device based on the control signal of which the level has been raised. The drive control section may control the semiconductor device to be in Off-state when the error detection section outputs the error detection signal.

The control section may have a control signal generation section that generates, in accordance with the input signal, the control signal which causes the semiconductor device to transition to On-state or Off-state. When the error detection signal is input, the error handling section may set a status of the control signal to be a status which causes the semiconductor device to transition to the Off-state, the control signal being generated as the release signal by the control signal generation section. When the control signal is in the status which causes the semiconductor device to transition to the Off-state, the error detection section may stop the output of the error detection signal.

The control signal generation section may generate the control signal which includes a set pulse signal having a pulse indicating a timing for causing the semiconductor device to transition to the On-state, and a reset pulse signal having a pulse indicating a timing for causing the semiconductor device to transition to the Off-state. The high side drive section may have a first latch section that receives the set pulse signal and the reset pulse signal, levels of the set pulse signal and the reset pulse signal having been raised by the first level shift section, and generates the control signal of which a logical value transitions in accordance with pulse timings of the set pulse signal and the reset pulse signal. The control signal output by the first latch section may be input to the error detection section.

The high side drive section may have a periodic pulse generation section that converts, for input to the second level shift section, the error detection signal output by the error detection section into an error detection pulse signal having a periodic pulse. The control section may have a second latch section that latches the error detection pulse signal for input to the error handling section.

The first level shift section may have a control signal shift circuit that raises a level of the control signal. The first level shift section may have a release signal shift circuit that raises a level of the release signal.

A second aspect of the present invention provides a semiconductor system including: a semiconductor device; and the drive circuit according to the first aspect, the drive circuit controlling the semiconductor device.

A third aspect of the present invention provides a drive method of driving a semiconductor device using a drive circuit including: a control section that generates a control signal in accordance with an input signal; a first level shift section that raises a level of a signal from the control section; a high side drive section that controls the semiconductor device based on the control signal of which the level has been raised by the first level shift section; and a second level shift section that lowers a level of a signal from the high side drive section for input to the control section. The drive method may include outputting an error detection signal when the semiconductor device is in an error status, and maintaining the output of the error detection signal until a release signal is input in the high side drive section as an error detection step. The drive method may include outputting the release signal to the high side drive section via the first level shift section when the error detection signal is input via the second level shift section in the control section as an error handling step. The drive method may include stopping the output of the error detection signal when the release signal is input to the error detection section as an error output stop step.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention will be described through embodiments of the invention, but the following embodiments do not limit the invention according to the claims. Further, not all the combinations of features described in the embodiments are essential for means to solve the problem in the invention.

Figure 1:
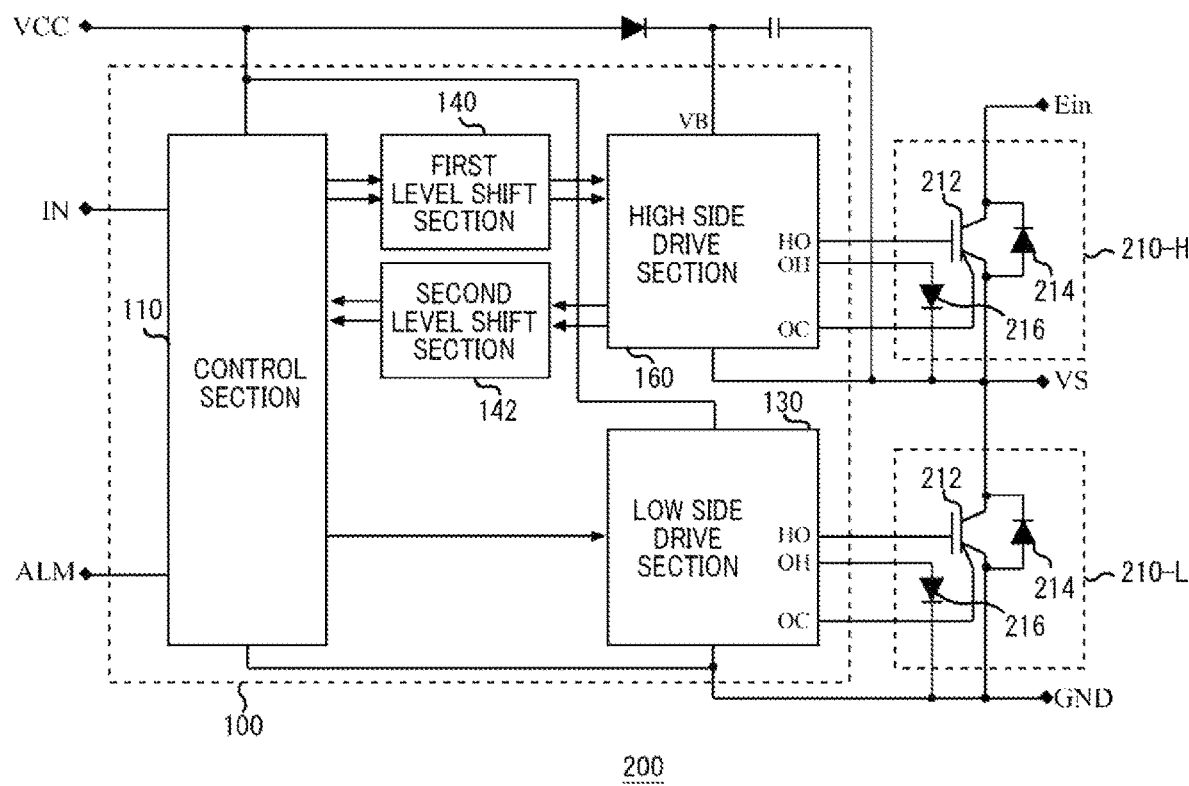
FIG. 1 is a diagram showing an example of a semiconductor system 200 in accordance with one embodiment of the invention.

FIG. 1 is a diagram showing an example of a semiconductor system 200 in accordance with one embodiment of the present invention. The semiconductor system 200 includes one or more semiconductor devices 210 and a drive circuit 100. The semiconductor device 210 may have a power semiconductor element such as an insulated gate bipolar transistor (IGBT). As an example, the semiconductor device 210 is a chip having a semiconductor substrate of silicon or the like. In each semiconductor device 210 of this example, a transistor 212, a free wheeling diode 214, and a temperature detection section 216 are provided on a single semiconductor substrate. The temperature detection section 216 is, for example, a diode. By measuring a characteristic of the temperature detection section 216, it is possible to detect a temperature of the semiconductor device 210. Further, the transistor 212 of this example outputs part of current flowing through the transistor 212 separately from a main current. Based on the current, it is possible to determine whether or not an overcurrent is flowing through the transistor 212.

The semiconductor system 200 of this example includes two semiconductor devices 210-H, 210-L which are connected in series. The two semiconductor devices 210-H/L are connected between a predetermined high potential Ein and a reference potential GND, and operate complementarily such that one is in On-state when the other is in Off-state. As a more specific example, the semiconductor devices 210-H/L constitute one of three arms provided in a three-phase inverter that drives a power source such as a motor. In this case, the semiconductor device 210-H operates as an upper arm, and the semiconductor device 210-L operates as a lower arm. A voltage VS at a connection point between the semiconductor device 210-H and the semiconductor device 210-L is an output of any of a U phase, a V phase, and a W phase.

The drive circuit 100 controls each semiconductor device 210. The drive circuit 100 of this example generates a gate signal to be input to a gate terminal of the transistor 212 of each semiconductor device 210.

The drive circuit 100 includes a control section 110, a high side drive section 160, a first level shift section 140, and a second level shift section 142. The drive circuit 100 of this example further includes a low side drive section 130.

The high side drive section 160 controls the semiconductor device 210-H on a high voltage side. The high side drive section 160 generates a gate signal of a high voltage substantially equal to an operating voltage of the semiconductor device 210-H in order to generate a gate signal that can control the semiconductor device 210-H. As an example, the high side drive section 160 operates using the output voltage VS of the semiconductor device 210-H as a reference voltage.

The low side drive section 130 controls the semiconductor device 210-L on a low voltage side. The control section 110 generates a control signal in accordance with an input signal. The input signal may be a binary signal indicating a timing for each semiconductor device 210 to be turned on and off. The control section 110 generates the control signal in accordance with the input signal so as to input the control signal to the low side drive section 130 and the high side drive section 160. The control section 110 and the low side drive section 130 are circuits that operate at a lower voltage than the high side drive section 160. As an example, the control section 110 and the low side drive section 130 operate using the ground potential GND as a reference voltage.

The first level shift section 140 raises a level of the signal from the control section 110 for input to the high side drive section 160. The first level shift section 140 may receive a first reference voltage of the control section 110 (GND in this example) and a second reference voltage of the high side drive section 160 (VS in this example). The first level shift section 140 raises the level of the control signal from a level in accordance with the first reference voltage to a level in accordance with the second reference voltage.

The high side drive section 160 controls the semiconductor device 210-H based on the control signal of which the level has been raised. The high side drive section 160 of this example has an output terminal HO that outputs a gate signal to the semiconductor device 210-H, a current detection terminal OC that detects current flowing through the semiconductor device 210-H, and a temperature detection terminal OH that detects a temperature of the semiconductor device 210-H.

When a status of the semiconductor device 210-H is a predetermined status, the high side drive section 160 determines that the status of the device is an error status. When the high side drive section 160 of this example detects either an overcurrent status in which the current flowing through the semiconductor device 210-H is equal to or higher than a reference value, or an overheat status in which the temperature of the semiconductor device 210-H is equal to or higher than a reference value, the high side drive section 160 determines that the status of the semiconductor device 210-H is the error status.

When the high side drive section 160 detects the error status, the high side drive section 160 outputs an error detection signal. The second level shift section 142 lowers a level of a signal from the high side drive section 160 for input to the control section 110. The second level shift section 142 of this example lowers a signal level of the error detection signal to a level that can be processed by the control section 110. The second level shift section 142 of this example lowers the level of the error detection signal for input to the control section 110, from a level of an error detection signal of which the reference is the second reference voltage VS to a level of an error detection signal of which the reference is the first reference voltage GND.

When the error detection signal is input, the control section 110 performs predetermined processing. For example, the control section 110 determines what type of error status the error detection signal is indicating to provide an alarm notification in accordance with the type of error status to an outside.

The high side drive section 160 maintains the output of the error detection signal until a predetermined release signal is input. The drive circuit 100 inputs the release signal is input to the high side drive section 160 at an appropriate timing so that a notification of the error detection signal to the control section 110 is ensured and a period during which the second level shift section 142 lowers the level of the error detection signal is shortened. Accordingly, power consumption in the second level shift section 142 is reduced.

Figure 2:
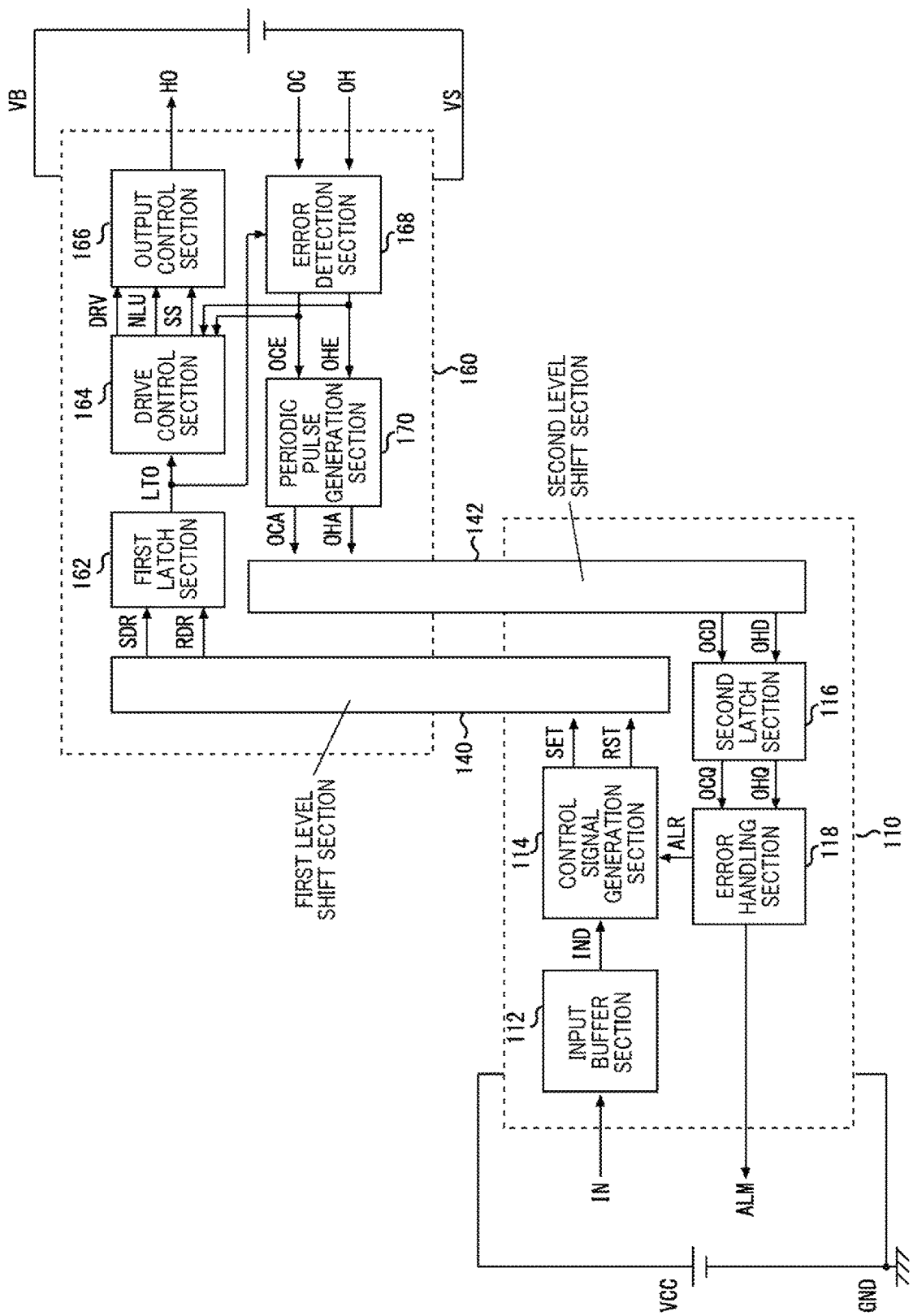
FIG. 2 is a diagram showing examples of a control section 110 and a high side drive section 160.

FIG. 2 is a diagram showing examples of the control section 110 and the high side drive section 160. As described above, the first level shift section 140 and the second level shift section 142 are provided between the control section 110 and the high side drive section 160.

The high side drive section 160 has an error detection section 168 that outputs error detection signals OCE/OHE when the semiconductor device 210-H is in the error status. In this example, the error detection signal OCE is a signal indicating the overcurrent status, and the error detection signal OHE is a signal indicating the overheat status. The error detection section 168 of this example receives a status signal OC (a current status) and a status signal OH (a temperature status) which indicate logic H when the semiconductor device 210-H is in the error status, and indicate logic L when the semiconductor device 210-H is in a normal status. When either the status signal OC or the status signal OH indicates logic H, the error detection section 168 sets a logical value of the corresponding signal of error detection signal OCE/OHE to logic H for output. In the specification, the outputting of the error detection signal refers to setting at least one of the error detection signal OCE and the error detection signal OHE to logic H for output. Note that as the logical value of the signal in each example, an opposite logical value can be appropriately used.

Further, after outputting the error detection signals OCE/OHE indicating logic H, the error detection section 168 maintains the output of the error detection signals OCE/OHE until the predetermined release signal is input. The error detection section 168 may continue to output the error detection signals OCE/OHE indicating logic H until the release signal is input, and may output, at constant intervals, the error detection signals OCE/OHE indicating logic H until the release signal is input.

The second level shift section 142 lowers, for input to the control section 110, levels of the error detection signals OCE/OHE output by the error detection section 168. The second level shift section 142 may lower, for input to the control section 110, the level of the signal generated by the high side drive section 160 based on the error detection signals OCE/OHE.

The control section 110 has an error handling section 118 that inputs the release signal to the high side drive section 160 when the error detection signal OCE/OHE of logic H are input via the second level shift section 142. The error handling section 118 may generate the release signal, or the error handling section 118 may generate a signal for generating the release signal.

As an example, the error handling section 118 generates a signal ALR for generating the release signal so that the release signal is output to the high side drive section 160 via the first level shift section 140. When the release signal is input via the first level shift section 140, the error detection section 168 stops the output of the error detection signals OCE/OHE. When the release signal is input, the error detection section 168 of this example sets both of the error detection signals OCE/OHE to logic L.

In the drive circuit 100, the signal ALR for generating the release signal is not generated until the error handling section 118 receives the error detection signals OCE/OHE. Therefore, at least until the error handling section 118 receives the error detection signals OCE/OHE, the error detection section 168 continues to output the error detection signals OCE/OHE. Therefore, when the error status is detected, the error detection signals OCE/OHE can be surely transmitted to the error handling section 118. Further, since the error handling section 118 generates the signal ALR for generating the release signal, the error detection section 168 can stop the output of the error detection signals OCE/OHE promptly after the error handling section 118 receives the error detection signals OCE/OHE. Therefore, the power consumption in the second level shift section 142 can be reduced.

Further, when the error detection signals OCE/OHE are received, the error handling section 118 outputs an alarm signal ALM to the outside. The error handling section 118 may determine what type of error (for example, the overcurrent status and the overheat status) has occurred based on the error detection signals OCE/OHE to output the alarm signal ALM in accordance with the type of error. The error handling section 118 may output the signal ALR for generating the release signal on condition that the alarm signal ALM has been output.

The high side drive section 160 of this example has a drive control section 164 and an output control section 166. The output control section 166 is a driver circuit that outputs a gate signal in accordance with an input drive control signal DRV. The drive control section 164 generates the drive control signal DRV based on the control signal which is generated by the control section 110 and of which the level is raised by the first level shift section 140. Accordingly, the drive control section 164 drives the semiconductor device 210-H.

When the error detection section 168 outputs the error detection signal OCE/OHE of logic H, the drive control section 164 controls the semiconductor device 210-H to be in the Off-state. The drive control section 164 controls the semiconductor device 210-H to be in the Off-state regardless of whether or not the release signal is sent from the control section 110 to the high side drive section 160. In this way, when the error of the semiconductor device 210-H is detected, it is possible to promptly control the semiconductor device 210-H to be in the Off-state so as to protect the semiconductor device 210-H and peripheral circuits.

When the error of the semiconductor device 210-H is detected, the drive control section 164 may set the semiconductor device 210-H in the Off-state after causing a voltage of the gate signal to transition to an intermediate voltage, or may set the semiconductor device 210-H in the Off-state without causing the voltage of the gate signal to transition to the intermediate voltage. The drive control section 164 may control the gate signal in accordance with the type of detected error. The drive control section 164 of this example outputs gate control signals NLU and SS for controlling the voltage of the gate signal in accordance with the type of detected error.

The control section 110 of this example has an input buffer section 112 and a control signal generation section 114. The input buffer section 112 buffers an input signal IN for sequential output. The signal output by the input buffer section 112 is referred to as an input signal IND.

The control signal generation section 114 generates the control signal which causes each semiconductor device 210 to transition to the On-state or the Off-state in accordance with the input signal IND. The control signal generation section 114 of this example generates the control signal which includes a set pulse signal SET having a pulse indicating a timing for causing the semiconductor device 210 to transition to the On-state, and a reset pulse signal RST having a pulse indicating a timing for causing the semiconductor device 210 to transition to the Off-state. FIG. 2 shows pulse signals SET/RST for controlling the semiconductor device 210-H.

The first level shift section 140 raises levels of the pulse signals SET/RST for input to the high side drive section 160. The drive control section 164 generates the drive control signal DRV having a logic pattern in accordance with the pulse signals SET/RST. Accordingly, the semiconductor device 210-H is controlled in accordance with the input signal IN.

The error handling section 118 causes the control signal generation section 114 to generate the release signal when the error detection signal OCE/OHE of logic H are input. The control signal generation section 114 sets a status of the control signal (the pulse signals SET/RST) to a status which causes the semiconductor device 210-H to transition to the Off-state, where the control signal (the pulse signals SET/RST) is generated as the release signal by the control signal generation section 114. When the signal ALR for generating the release signal is received from the error handling section 118, the control signal generation section 114 of this example generates the pulse of the reset pulse signal RST. That is, the error handling section 118 of this example uses the reset pulse signal RST for controlling the semiconductor device 210-H as the release signal.

When the control signal (the reset pulse signal RST in this example) is in the status which causes the semiconductor device 210-H to transition to the Off-state (in this example, a status in which the pulse appears in the reset pulse signal RST), the error detection section 168 stops the output of the error detection signals OCE/OHE. In this example, since the reset pulse signal RST for controlling the semiconductor device 210-H is used as the release signal, a level shift circuit or the like for transmitting the release signal may not be separately provided. Therefore, a size of the circuit can be reduced.

In this example, the output of the error detection signals OCE/OHE from the error detection section 168 is stopped by a normal reset pulse signal RST as well, where the normal reset pulse signal RST is generated in accordance with the input signal IN. Since the reset pulse signal RST is a signal that causes the semiconductor device 210-H to transition to the Off-state, even when the output of the error detection signals OCE/OHE is stopped before the alarm signal ALM is output, no major problem occurs. Further, in a case where the error status is detected when the semiconductor device 210-H is in the On-state again, the error detection signals OCE/OHE are output again, and the alarm signal ALM only needs to be output at that time.

Further, the high side drive section 160 of this example has a first latch section 162 that receives a set pulse signal SDR and a reset pulse signal RDR, where levels of the set pulse signal SDR and the reset pulse signal RDR have been raised by the first level shift section 140, and generates a control signal LTO of which a logical value transitions in accordance with pulse timings of the set pulse signal SDR and the reset pulse signal RDR. The first latch section 162 of this example generates the control signal LTO that transitions to logic H at the pulse timing of the set pulse signal SDR and transitions to logic L at the pulse timing of the reset pulse signal RDR.

The control signal LTO is a signal having a logic pattern similar to the input signals IN and IND. The control signal generation section 114 converts the input signal IND into a pulse signal and the first level shift section 140 raises the level, and thus a period during which the current flows through the first level shift section 140 can be shortened in comparison with a case where the level of the input signal IND is directly raised by the first level shift section 140. Therefore, the power consumption in the first level shift section 140 can be reduced.

The control signal LTO output by the first latch section 162 is input to the error detection section 168 of this example as the release signal. The error detection section 168 stops the output of the error detection signals OCE/OHE when the control signal LTO indicates logic L. By using the control signal LTO as the release signal, a period during which the error detection section 168 can detect the release signal (in this example, a period during which the control signal LTO indicates logic L) becomes long in comparison with a case where the pulse signal is used as the release signal, and thus a detection omission of the release signal can be reduced. In another example, the error detection section 168 may stop the output of the error detection signals OCE/OHE in accordance with the pulse of the reset pulse signal RDR of which the level has been raised. In this case, the reset pulse signal RDR is input to the error detection section 168 without passing through the first latch section 162.

The high side drive section 160 of this example has a periodic pulse generation section 170 that converts, for input to the second level shift section 142, the error detection signals OCE/OHE output by the error detection section 168 into error detection pulse signals OCA/OHA having periodic pulses. While the error detection signals OCE/OHE indicate logic H, the periodic pulse generation section 170 of this example continues to generate pulses as the corresponding error detection pulse signals OCA/OHA. A period at which the periodic pulse generation section 170 outputs a pulse may be same as or shorter than a period during which the error detection section 168 detects the error.

By the periodic pulse generation section 170 generating the error detection pulse signals OCA/OHA, it is possible to reduce the power consumption in the second level shift section 142. Further, by the periodic pulse generation section 170 outputting the periodic pulse, the control section 110 can surely receive the error detection pulse signal in comparison with a case where a single pulse is generated. For example, even when the pulse input to the second level shift section 142 cannot be detected by the control section 110 due to a fluctuation in the reference voltage VS input to the second level shift section 142, it becomes possible, due to a periodic input of the pulse to the second level shift section 142, for the control section 110 to detect the pulse after the fluctuation of the reference voltage VS settles down.

The second level shift section 142 outputs error detection pulse signals OCD/OHD obtained by lowering the level of the error detection pulse signals OCA/OHA. The control section 110 may have a second latch section 116 that outputs error detection latch signals OCQ/OHQ obtained by latching the error detection pulse signals OCD/OHD.

The second latch section 116 outputs the error detection latch signals OCQ/OHQ which transition to logic H at timings when the error detection pulse signals OCD/OHD indicate the pulses, and maintain logic H until a reset signal is input. The error handling section 118 may also input the signal ALR for generating the release signal to the second latch section 116 as the reset signal.

Figure 3:
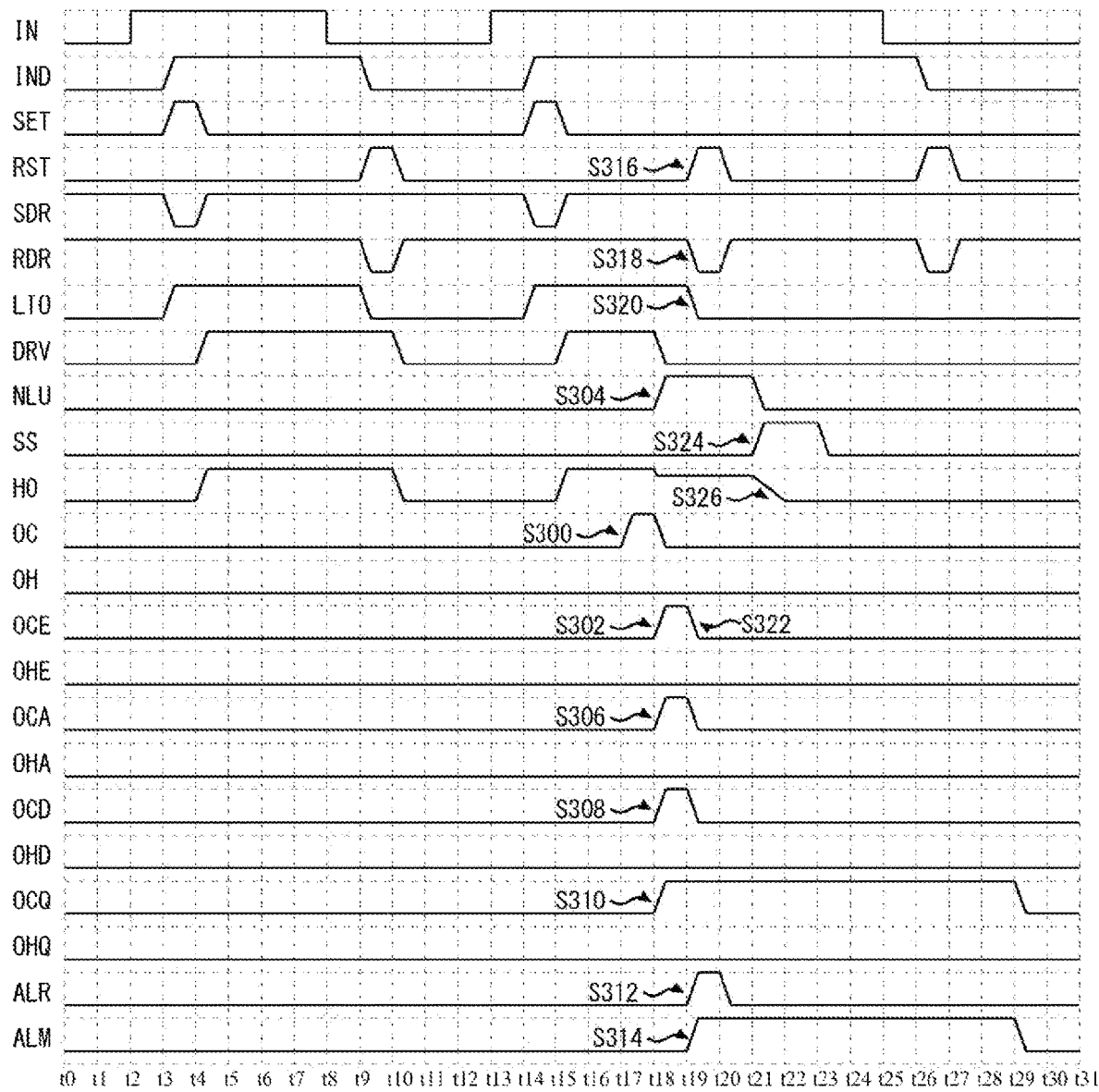
FIG. 3 is a timing chart showing operation examples of the control section 110 and the high side drive section 160.

FIG. 3 is a timing chart showing operation examples of the control section 110 and the high side drive section 160. The control section 110 and the high side drive section 160 of this example perform normal processing in accordance with the input signals from a timing t0 to a timing t16, and perform processing in accordance with the error detection from a timing t17.

As described above, in the normal processing, the control signal generation section 114 generates each of the set pulse signal SET and the reset pulse signal RST having a pulse at a timing corresponding to an edge of the input signal IN. The first level shift section 140 generates the set pulse signal SDR and the reset pulse signal RDR obtained by raising the levels of the pulse signals SET/RST. The pulse signals SDR/RDR of this example have logic patterns obtained by inverting logic patterns of the pulse signals SET/RST.

The first latch section 162 generates the control signal LTO of which the logical value transitions in accordance with the pulse timings of the pulse signals SDR/RDR. The drive control section 164 generates the drive control signal DRV in accordance with the control signal LTO. The output control section 166 outputs a gate signal HO in accordance with the drive control signal DRV. Accordingly, the semiconductor device 210-H can be controlled in accordance with the input signal IN.

In this example, at the timing t17, the current status signal OC indicates the error status (S300). The error detection section 168 causes the logical value of the error detection signal OCE to transition to logic H (S302). The periodic pulse generation section 170 periodically outputs a pulse as the error detection pulse signal OCA (S306). Note that in the example of FIG. 3, an output voltage HO decreases before the periodic pulse generation section 170 outputs a subsequent pulse, and the output of the error detection signal OCE changes to a status indicating the normal status (the transition to logic L), and thus as the error detection pulse signal OCA, one pulse alone is output. In another example, as the error detection pulse signal OCA, the periodic pulse generation section 170 may output a plurality of pulses.

The second level shift section 142 outputs the error detection pulse signal OCD obtained by lowering the level of the error detection pulse signal OCA (S308). The second latch section 116 outputs the error detection latch signal OCQ obtained by latching the error detection pulse signal OCD (S310).

The error handling section 118 generates the signal ALR for generating the release signal in accordance with the error detection latch signal OCQ (S312). Further, the error handling section 118 outputs the alarm signal ALM in accordance with the error detection latch signal OCQ (S314). The error handling section 118 may input the reset signal (not shown) to the second latch section 116 after ending the output of the alarm signal ALM.

The control signal generation section 114 outputs a pulse as the reset pulse signal RST in accordance with the signal ALR for generating the release signal (S316). The pulse is generated irrespective of the pattern of the input signal IN. In this example, the pulse is used as the release signal.

The first level shift section 140 raises the level of the pulse for output (S318). The first latch section 162 sets the control signal LTO to logic L in accordance with the pulse (S320). The error detection section 168 stops the output of the error detection signal OCE in accordance with the transition of the control signal LTO to logic L (S322). In this example, as the release signal generated in accordance with the signal ALR for generating the release signal, parts of the reset pulse signal RST, the reset pulse signal RDR, and the control signal LTO are sequentially converted and used.

Further, the drive control section 164 controls the gate signal HO in accordance with the error detection signal OCE output in S302. The drive control section 164 of this example causes the gate control signal NLU to transition to logic H in accordance with the error detection signal OCE (S304). The output control section 166 causes a voltage of the gate signal HO to transition to a voltage between level H and level L in accordance with the gate control signal NLU. After a predetermined period has elapsed, the drive control section 164 causes the gate control signal NLU to transition to logic L and causes the gate control signal SS to transition to logic H (S324). The output control section 166 performs soft shutdown processing of gradually lowering the voltage of the gate signal HO in accordance with the gate control signal SS (S326).

By such processing, when the error is detected, it is possible to surely notify the control section 110 of the error detection signal and to minimize a period during which the error detection signal is output. Further, the semiconductor device 210-H can be promptly controlled to be in the Off-state.

Figure 4:
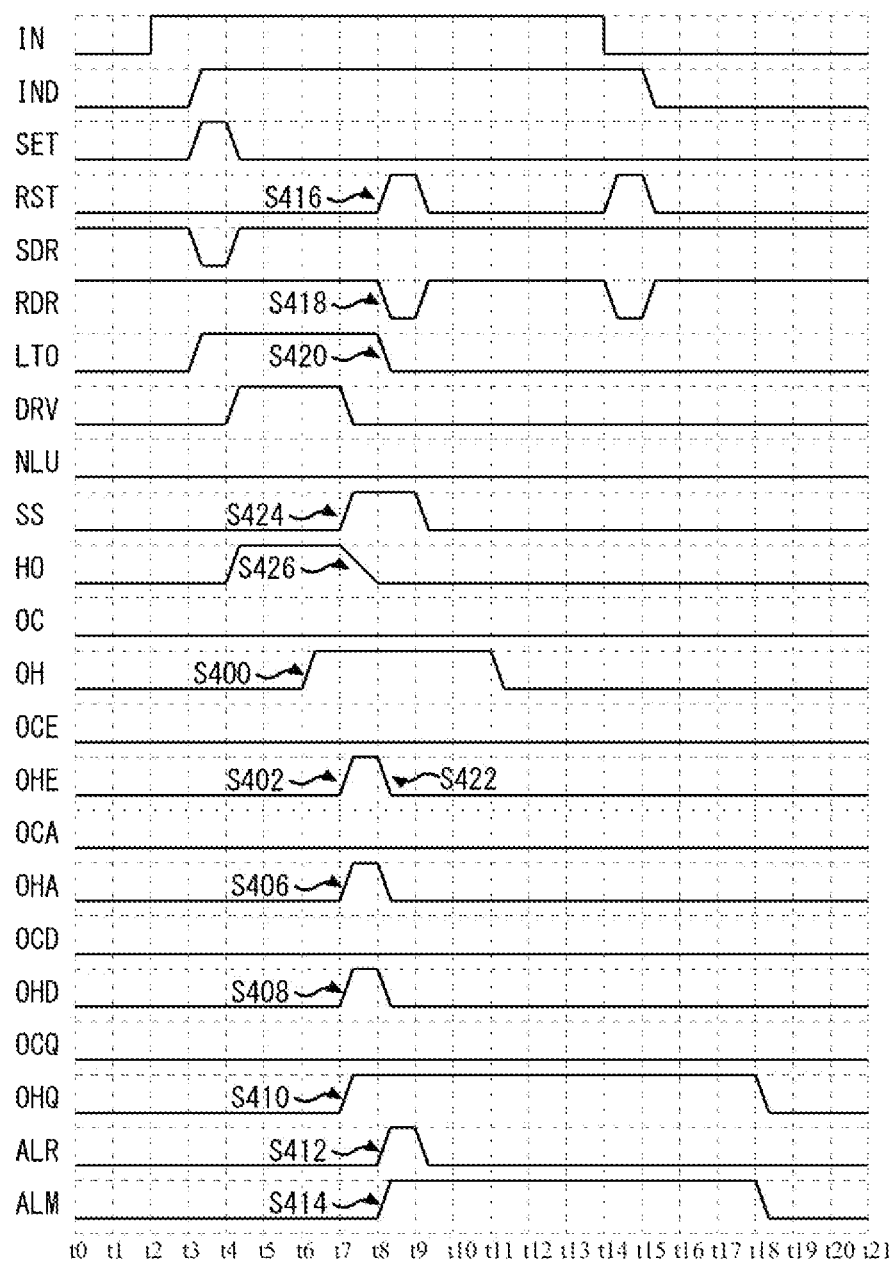
FIG. 4 is a timing chart showing operation examples of the control section 110 and the high side drive section 160.

FIG. 4 is a timing chart showing operation examples of the control section 110 and the high side drive section 160. In this example, at the timing t6, the temperature status signal OH indicates the error status (S400). The error detection section 168 causes the logical value of the error detection signal OHE to transition to logic H (S402). The periodic pulse generation section 170 periodically outputs a pulse as the error detection pulse signal OHA (S406).

The second level shift section 142 outputs the error detection pulse signal OHD obtained by lowering the level of the error detection pulse signal OHA (S408). The second latch section 116 outputs the error detection latch signal OHQ obtained by latching the error detection pulse signal OHD (S410).

The error handling section 118 generates the signal ALR for generating the release signal in accordance with the error detection latch signal OHQ (S412). Further, the error handling section 118 outputs the alarm signal ALM in accordance with the error detection latch signal OHQ (S414).

The control signal generation section 114 outputs a pulse as the reset pulse signal RST in accordance with the signal ALR for generating the release signal (S416). The first level shift section 140 raises the level of the pulse for output (S418). The first latch section 162 sets the control signal LTO to logic L in accordance with the pulse (S420). The error detection section 168 stops the output of the error detection signal OHE in accordance with the transition of the control signal LTO to logic L (S422).

Further, the drive control section 164 controls the gate signal HO in accordance with the error detection signal OHE output in S402. The drive control section 164 of this example causes the gate control signal SS to transition to logic H in accordance with the error detection signal OHE (S424). The output control section 166 performs the soft shutdown processing of gradually lowering the voltage of the gate signal HO in accordance with the gate control signal SS (S426). In this example, the gate control signal SS is caused to transition to logic H while the gate control signal NLU is not caused to transition to logic H. As described above, the control of the gate signal may be caused to vary depending on the type of error status.

Further, in the example of FIG. 3, the overcurrent status is promptly resolved by lowering the voltage of the gate signal HO to the intermediate voltage, and thus the current status signal OC promptly transitions to logic L. In contrast, in the example of FIG. 4, even when the gate signal HO is controlled, the temperature of the semiconductor device 210-H does not immediately decrease. Therefore, the temperature status signal OH may continue to indicate logic H for a relatively long period of time.

Even when the temperature status signal OH (or the current status signal OC) indicates logic H, the error detection section 168 of this example does not output the error detection signal while the control signal LTO indicates logic L. That is, the error detection section 168 may output the error detection signal on condition that the status signal indicates an error value and the control signal LTO indicates logic H.

Figure 5:
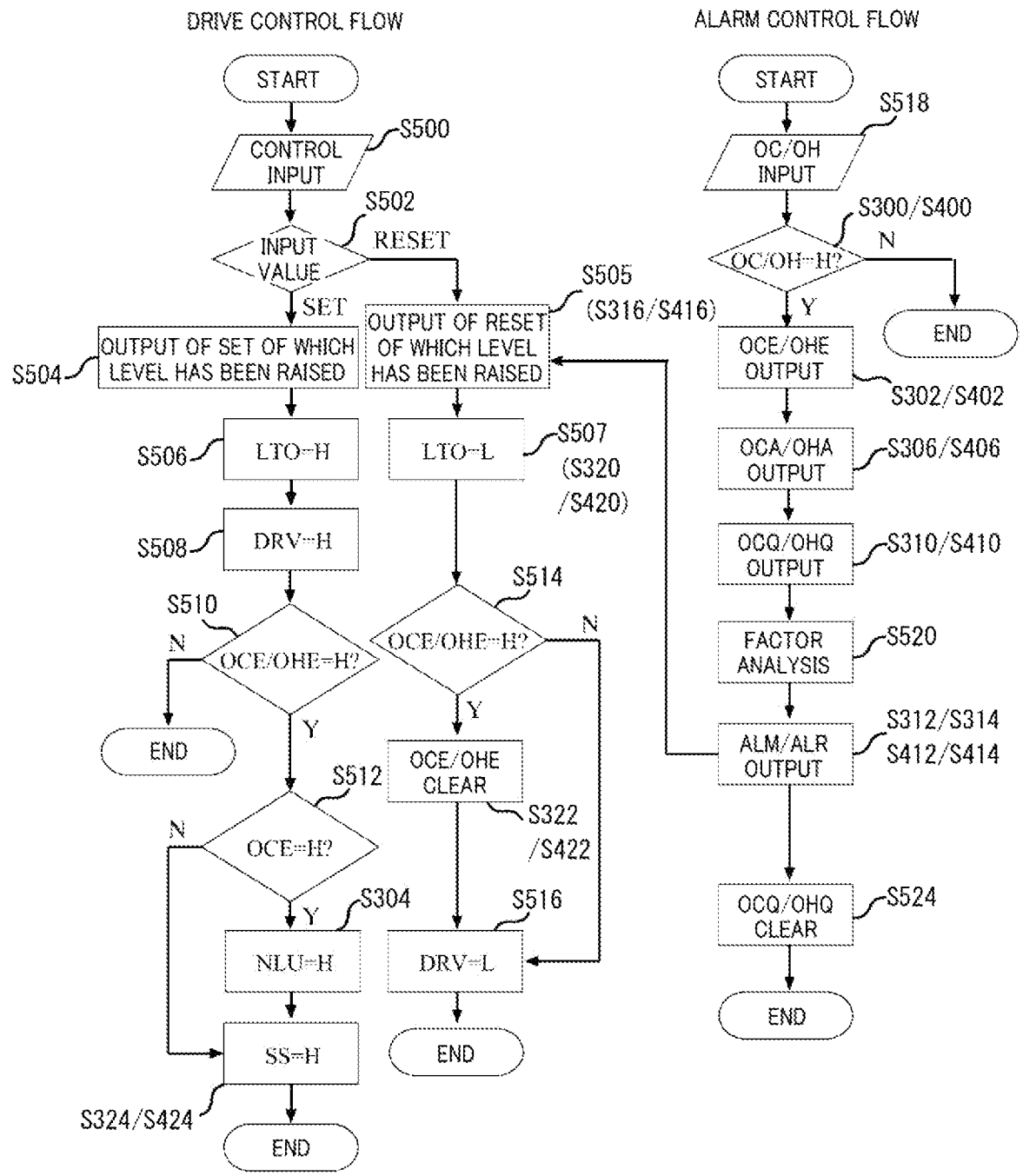
FIG. 5 is a flowchart showing operation examples of the control section 110 and the high side drive section 160.

FIG. 5 is a flowchart showing operation examples of the control section 110 and the high side drive section 160. The operations of the control section 110 and the high side drive section 160 in this example are similar to those in the examples shown in FIG. 3 and FIG. 4. In FIG. 5, processing corresponding to the processing described in each of FIG. 3 and FIG. 4 is denoted by the same reference signs and numerals as those in each of FIG. 3 and FIG. 4.

FIG. 5 shows a drive control flow mainly showing an operation for controlling the drive control section 164, and an alarm control flow mainly showing operations for controlling the error detection section 168 and the error handling section 118.

In the drive control flow, first, the input signal IN is input to the control section 110 (S500). The control signal generation section 114 outputs the set pulse signal SET or the reset pulse signal RST in accordance with a value of the input signal IN (S502).

The first level shift section 140 raises the level of the input set pulse signal SET or the input reset pulse signal RST for output (S504, S505). The first latch section 162 controls the logical value of the control signal LTO in accordance with the set pulse signal SDR and the reset pulse signal RDR output from the first level shift section 140, the levels of the set pulse signal SDR and the reset pulse signal RDR having been raised by the first level shift section 140 (S506, S507).

When the control signal LTO is logic H (S506), the drive control section 164 sets the drive control signal DRV to logic H (S508). The drive control section 164 determines whether or not the error detection section 168 outputs the error detection signals OCE/OHE (S510). When the error detection signal is not output, the drive control section 164 controls the semiconductor device 210-H in accordance with the drive control signal DRV generated in S508.

When the error detection signal is output, the drive control section 164 determines what type of error status has occurred (S512). When the error status is the overcurrent status, the drive control section 164 causes the gate control signal NLU to transition to logic H (S304), and after a predetermined time has elapsed, the drive control section 164 causes the gate control signal SS to transition to logic H (S324). Further, when the error status is the overheat status, the drive control section 164 causes the gate control signal SS to transition to logic H without causing the gate control signal NLU to transition to logic H (S424). Accordingly, the semiconductor device 210-H is subjected to the soft shutdown.

Subsequently, a case where the control signal LTO is logic L (S507) will be described. When the error detection section 168 does not output the error detection signals OCE/OHE (a branch N in S514), the drive control section 164 sets the drive control signal DRV to logic L (S516). The drive control section 164 controls the semiconductor device 210-H in accordance with the drive control signal DRV.

In a case where the error detection section 168 outputs the error detection signals OCE/OHE (a branch Y in S514), the error detection section 168 causes the error detection signals OCE/OHE to transition to logic L at the timing when the control signal LTO transitions to logic L (S322/S422). The processing may be the same regardless of the type of error status. Further, the drive control section 164 sets the drive control signal DRV to logic L (S516).

Subsequently, the alarm control flow will be described. The error detection section 168 receives the status signal OC/OH (S518). The error detection section 168 determines whether any of the status signals indicates the error status (logic H) (S300, S400). When none of the status signals indicates the error status, the error detection section 168 ends the processing.

When the status signals OC/OH indicate the error statuses, the error detection section 168 outputs the error detection signals OCE/OHE (S302/S402). The periodic pulse generation section 170 outputs the error detection pulse signals OCA/OHA in accordance with the error detection signals OCE/OHE (S306/S406).

The second latch section 116 outputs the error detection latch signals OCQ/OHQ in accordance with the error detection pulse signals OCA/OHA, the levels of the error detection pulse signals OCA/OHA having been lowered by the second level shift section 142 (S310/S410). The error handling section 118 determines the type of error status based on the error detection latch signals OCQ/OHQ (S520).

The error handling section 118 generates the alarm signal ALM and the signal ALR for generating the release signal (S312, S314, S412, S414). The error handling section 118 inputs the reset signal to the second latch section 116, and causes the error detection latch signals OCQ/OHQ to transition to logic L (S524).

When the error handling section 118 outputs the signal ALR, processing from S505 is performed in the drive control flow. The processing in S505 in accordance with the output of the signal ALR corresponds to the processing in each of S316 and S416 described in FIG. 3 and FIG. 4. The processing after S505 is as described above.

Figure 6:
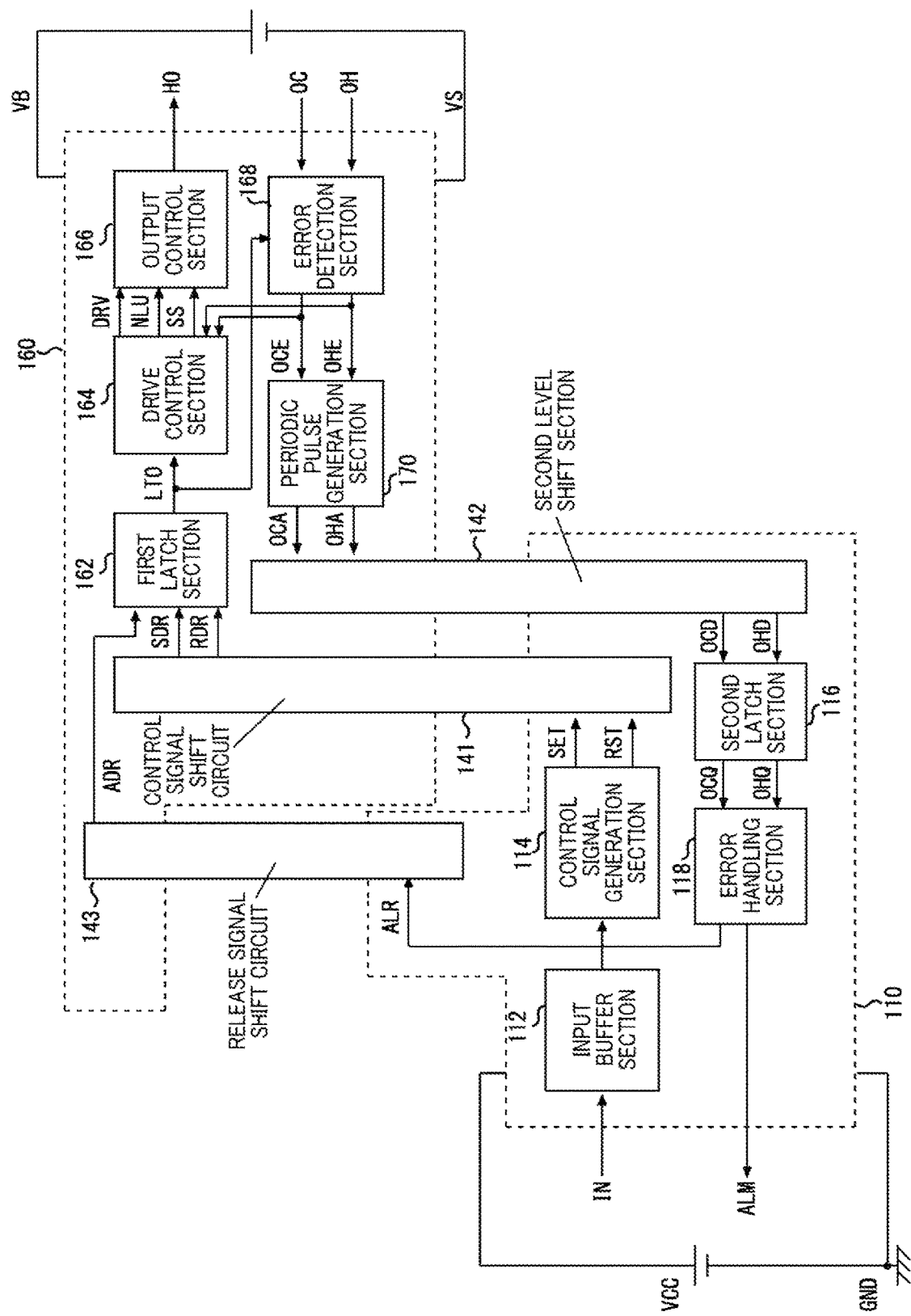
FIG. 6 is a diagram showing another configuration example of a first level shift section 140, the control section 110, and the high side drive section 160.

FIG. 6 is a diagram showing another configuration example of the first level shift section 140, the control section 110, and the high side drive section 160. In this example, the first level shift section 140 has a control signal shift circuit 141 and a release signal shift circuit 143. The control signal shift circuit 141 raises levels of the control signals (in this example, the set pulse signal SET and the reset pulse signal RST). The release signal shift circuit 143 raises a level of the release signal ALR. In this example, the error handling section 118 generates the release signal ALR. The release signal ALR is, for example, a pulse signal.

In the drive circuit 100 of this example, the levels of the control signal and the release signal are raised respectively by the shift circuits different from each other and are input to the high side drive section 160. When the release signal shift circuit 143 outputs the release signal (in this example, when a release signal ADR of which the level has been raised indicates logic L), the first latch section 162 causes the control signal LTO to transition to logic L regardless of the value of the pulse signals SDR/RDR.

With such a configuration as well, similar to the examples described in FIG. 1 to FIG. 5, when the error is detected, it is possible to surely notify the control section 110 of the error detection signal and to minimize a period during which the error detection signal is output. Further, the semiconductor device 210-H can be promptly controlled to be in the Off-state.

Figure 7:
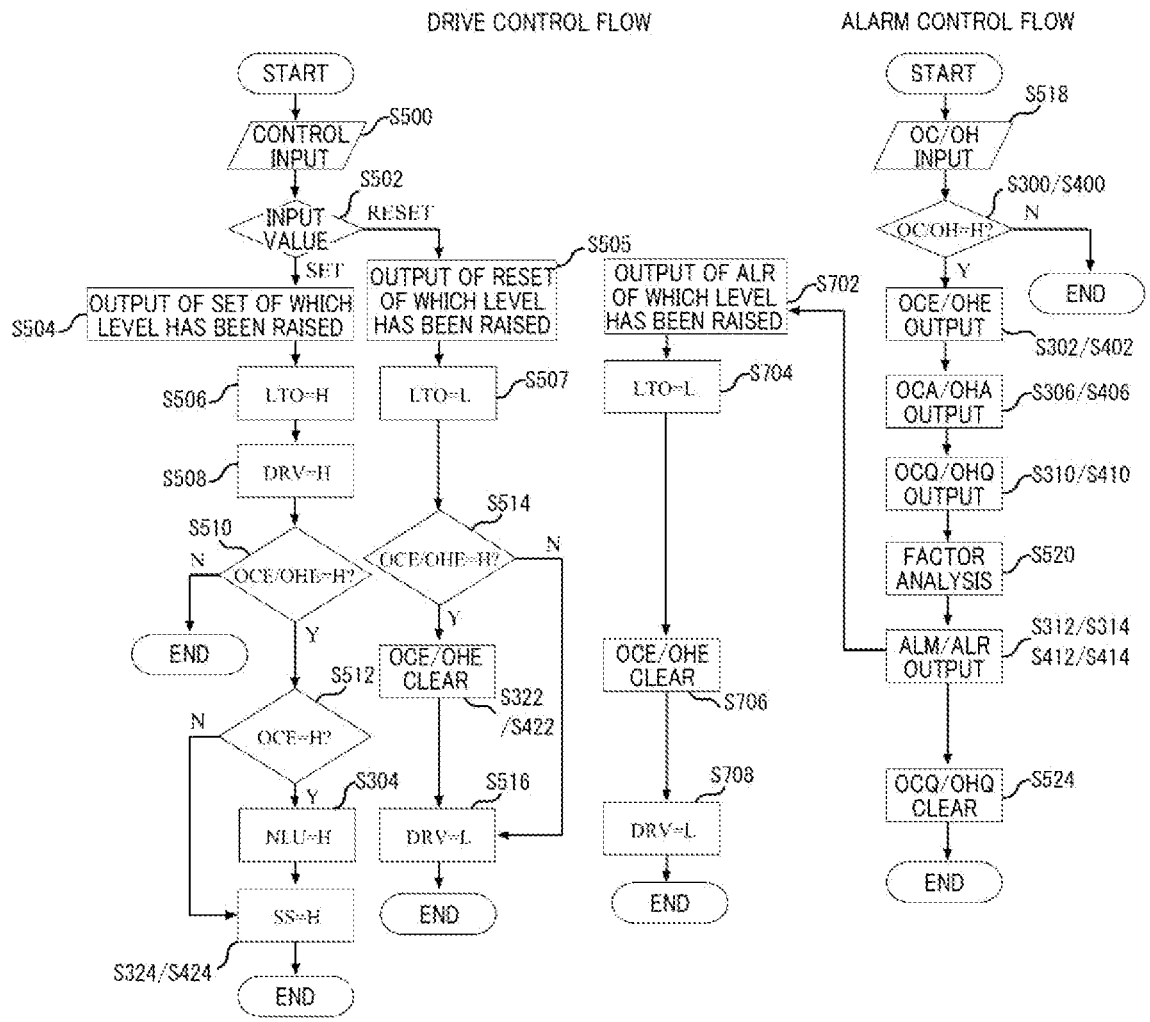
FIG. 7 is a flowchart showing operation examples of the control section 110 and the high side drive section 160 showed in FIG. 6.

FIG. 7 is a flowchart showing operation examples of the control section 110 and the high side drive section 160 showed in FIG. 6. In comparison with the operation flow shown in FIG. 5, the operation flow of this example is different in the drive control flow after the output of the signal ALR in the processing of S312 and S412 of the alarm control flow. The other processing is the same as the example described in FIG. 5

The error handling section 118 of this example outputs the release signal ALR to the release signal shift circuit 143 (S312, S412). The release signal shift circuit 143 raises the level of the release signal ALR for output (S702). When a pulse of the release signal ADR of which the level has been raised is input, the first latch section 162 causes the control signal LTO to transition to logic L (S704). Further, the drive control section 164 causes the drive control signal DRV to transition to logic L in accordance with the control signal LTO (S708).

Figure 8:
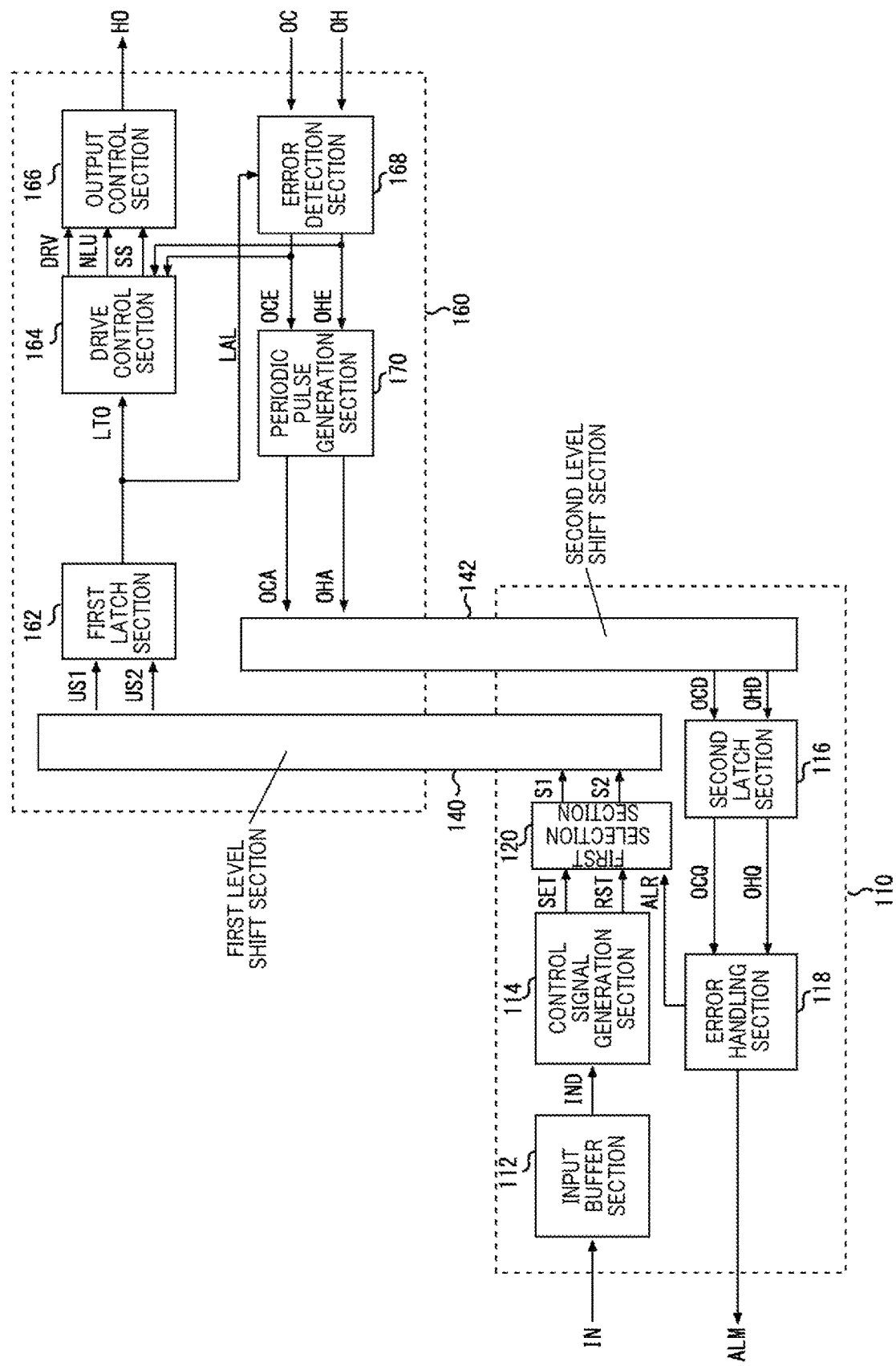
FIG. 8 is a diagram showing another configuration example of the control section 110 and the high side drive section 160.

FIG. 8 is a diagram showing another configuration example of the control section 110 and the high side drive section 160. The control section 110 of this example has a first selection section 120. The error handling section 118 of this example generates the release signal ALR. The release signal ALR may be a pulse signal.

The first selection section 120 selects, for input to the first level shift section 140, either the pulse signals SET/RST generated by the control signal generation section 114 or the release signal ALR generated by the error handling section 118. When the release signal ALR is input, the first selection section 120 may preferentially input the release signal ALR to the first level shift section 140. When the release signal ALR is input, the first selection section 120 may input the release signal ALR instead of the reset pulse signal RST to the first level shift section 140. In this case, the first selection section 120 may not input the set pulse signal SET to the first level shift section 140.

The first latch section 162 generates the control signal LTO based on the signal output by the first level shift section 140. The first latch section 162 may cause the control signal LTO to transition to logic L when the reset pulse signal RST of which the level has been raised is input, or the release signal ALR of which the level has been raised is input.

With such a configuration as well, similar to the examples described in FIG. 1 to FIG. 5, when the error is detected, it is possible to surely notify the control section 110 of the error detection signal and to minimize a period during which the error detection signal is output. Further, the semiconductor device 210-H can be promptly controlled to be in the Off-state.

Figure 9:
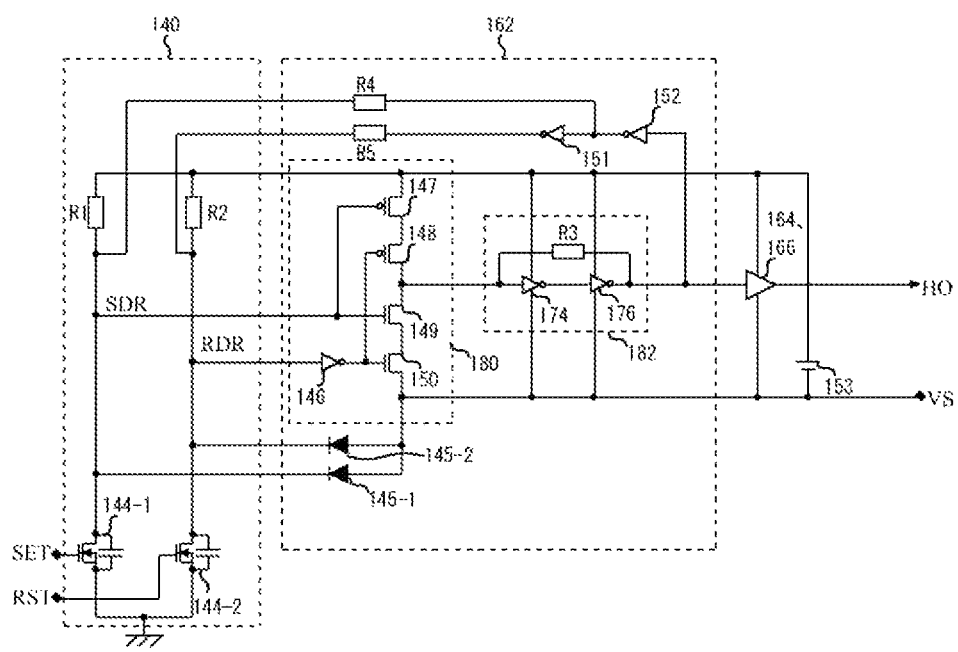
FIG. 9 is a diagram showing a configuration example of the first level shift section 140 and a first latch section 162.

FIG. 9 is a diagram showing a configuration example of the first level shift section 140 and the first latch section 162. The first level shift section 140 has a series circuit of a resistor R1 and an N-channel MOS transistor 144-1 and a series circuit of a resistor R2 and an N-channel MOS transistor 144-2. The set pulse signal SET and the reset pulse signal RST are input to the N-channel MOS transistors 144, respectively. By the N-channel MOS transistors 144 operating in accordance with the pulse signals, the pulse signals SDR/RDR obtained by raising the levels of the pulse signals SET/RST can be generated.

The first latch section 162 has a transmission circuit 180. The transmission circuit 180 has P-channel MOS transistors 147, 148 and N-channel MOS transistors 149, 150 provided in series between a high-voltage side terminal of a power supply 153 and the potential VS. The transmission circuit 180 has an inverter 146. An input terminal of the inverter 146 is connected to a connection point between the resistor R2 and the N-channel MOS transistor 144-2, and an output terminal of the inverter 146 is connected to gate terminals of the P-channel MOS transistor 148 and the N-channel MOS transistor 150. That is, a signal obtained by inverting the reset pulse signal RDR is input to the gate terminals of the P-channel MOS transistor 148 and the N-channel MOS transistor 150.

Further, a connection point between the resistor R1 and the N-channel MOS transistor 144-1 is connected to gate terminals of the P-channel MOS transistor 147 and the N-channel MOS transistor 149. That is, the set pulse signal SDR is input to the gate terminals of the P-channel MOS transistor 147 and the N-channel MOS transistor 149.

The first latch section 162 has diodes 145-1, 145-2. An output terminal of the diode 145-1 is connected to a connection point between the resistor R1 and the N-channel MOS transistor 144-1. An input terminal of the diode 145-1 is connected to the second reference voltage VS. An output terminal of the diode 145-2 is connected to a connection point between the resistor R2 and the N-channel MOS transistor 144-2. An input terminal of the diode 145-2 is connected to the second reference voltage VS.

The first latch section 162 has a latch circuit 182. The latch circuit 182 has an inverter 174, an inverter 176, and a resistor R3. An input terminal of the inverter 174 is connected to a connection point between the P-channel MOS transistor 148 and the N-channel MOS transistor 149, the connection point being an output terminal of the transmission circuit 180. An input terminal of the inverter 176 is connected to an output terminal of the inverter 174. The resistor R3 connects an output terminal of the inverter 176 to the input terminal of the inverter 174. That is, the latch circuit 182 latches an output of the transmission circuit 180 for output. An output terminal of the latch circuit 182 is connected to the drive control section 164. In the example of FIG. 9, the drive control section 164 and the output control section 166 are collectively shown as a driver circuit.

Further, the first latch section 162 has an inverter 152, an inverter 151, a resistor R4, and a resistor R5. An input terminal of the inverter 152 is connected to the output terminal of the latch circuit 182. An input terminal of the inverter 151 is connected to an output terminal of the inverter 152. The resistor R5 connects an output terminal of the inverter 151 to a connection point between the resistor R2 and the N-channel MOS transistor 144-2. The resistor R4 connects the output terminal of the inverter 152 to a connection point between the resistor R1 and the N-channel MOS transistor 144-1.

In the first level shift section 140, due to noise by switching or the like of the semiconductor device 210, levels of both of a voltage at the connection point between the resistor R1 and the N-channel MOS transistor 144-1 and a voltage at the connection point between the resistor R2 and the N-channel MOS transistor 144-2 may become level L. In this case, the output of the first latch section 162 is not stable, and the operation of the semiconductor device 210 becomes unstable.

When the levels of both of the voltages at these connection points become L level, the transmission circuit 180 sets the P-channel MOS transistor 148 and the N-channel MOS transistor 149 to be in Off-state, and sets the output terminal of the transmission circuit 180 to be in a high impedance status. Accordingly, even when the noise occurs, the latch circuit 182 can maintain the same output status.

The first level shift section 140 and the first latch section 162 described in FIG. 1 to FIG. 8 may have the configuration described in FIG. 9. By using the first level shift section 140 and the first latch section 162 shown in FIG. 9, it is possible to reduce an influence of the noise and to provide the notification of the release signal from the control section 110 to the high side drive section 160.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

100: drive circuit
110: control section
112: input buffer section
114: control signal generation section
116: second latch section
118: error handling section
120: first selection section
130: low side drive section
140: first level shift section
141: control signal shift circuit
142: second level shift section
143: release signal shift circuit
144: N-channel MOS transistor
145: diode
146: inverter
147: P-channel MOS transistor
148: P-channel MOS transistor
149: N-channel MOS transistor
150: N-channel MOS transistor
151: inverter
152: inverter
153: power supply
160: high side drive section
162: first latch section
164: drive control section
166: output control section
168: error detection section
170: periodic pulse generation section
174: inverter
176: inverter
180: transmission circuit
182: latch circuit
200: semiconductor system
210: semiconductor device
212: transistor
214: free wheeling diode
216: temperature detection section

What is claimed is:

1. A drive circuit of a semiconductor device comprising:
a control section configured to output (i) a control signal in accordance with an input signal and (ii) a release signal when an error detection signal is input thereto;
a first level shift section configured to raise a level of the control signal and a level of the release signal input from the control section;
a high side drive section configured to control the semiconductor device based on the control signal of which the level has been raised by the first level shift section; and
a second level shift section configured to lower a level of a signal from the high side drive section for input to the control section, wherein
the high side drive section has an error detection section configured to output the error detection signal when the semiconductor device is in an error status, and maintain the output of the error detection signal until the release signal of which the level has been raised by the first level shift section is input,
the control section has:
a control signal generation section configured to generate the control signal in accordance with the input signal;
an error handling section configured to generate the release signal when the error detection signal is input via the second level shift section; and
a first selection section configured to receive the control signal from the control signal generation section and the release signal from the error handling section, select either the control signal or the release signal, and output the selected signal to the first level shift section, and
the error detection section stops the output of the error detection signal when the release signal of which the level has been raised by the first level shift section is input.

2. The drive circuit according to claim 1, wherein
the high side drive section further has a drive control section configured to drive the semiconductor device based on the control signal of which the level has been raised, and
the drive control section is configured to control the semiconductor device to be in Off-state when the error detection section outputs the error detection signal.

3. The drive circuit according to claim 1, wherein
when the release signal is received from the error handling section, the first selection section selects the release signal and outputs the selected release signal to the first level shift section.

4. The drive circuit according to claim 1, wherein
the control signal generation section generates, in accordance with the input signal, the control signal which includes a set pulse signal having a pulse indicating a timing for causing the semiconductor device to transition to On-state, and a reset pulse signal having a pulse indicating a timing for causing the semiconductor device to transition to Off-state, the high side drive section further has a first latch section configured to receive the set pulse signal, the reset pulse signal, and the release signal, levels of the set pulse signal, the reset pulse signal, and the release signal having been raised by the first level shift section, and the first latch section (i) generates the control signal having a logical value H for causing the semiconductor device to transition to the On-state when the first latch section receives the set pulse signal of which the level has been raised by the first level shift section and (ii) generates the control signal having a logical value L for causing the semiconductor device to transition to the Off-state when the first latch section receives the reset pulse signal or the release signal of which the level has been raised by the first level shift section.

5. The drive circuit according to claim 4, wherein
the control signal generated by the first latch section is input to the error detection section.

6. The drive circuit according to claim 5, wherein
when the control signal having the logical value L for causing the semiconductor device to transition to the Off-state is input to the error detection section, the error detection section stops the output of the error detection signal.

7. The drive circuit according to claim 4, wherein
when the release signal is received from the error handling section, the first selection section outputs, to the first level shift section, the release signal instead of the reset pulse signal and does not output the set pulse signal.

8. The drive circuit according to claim 4, wherein
the high side drive section further has a periodic pulse generation section configured to convert, for input to the second level shift section, the error detection signal output by the error detection section into an error detection pulse signal having a periodic pulse, and the control section further has a second latch section configured to latch the error detection pulse signal for input to the error handling section.

9. A semiconductor system comprising:
the semiconductor device; and
the drive circuit according to claim 1, the drive circuit controlling the semiconductor device.

10. A drive method of driving a semiconductor device using a drive circuit including: a control section configured to output (i) a control signal in accordance with an input signal and (ii) a release signal when an error detection signal is input thereto; a first level shift section configured to raise a level of the control signal and a level of the release signal input from the control section; a high side drive section configured to control the semiconductor device based on the control signal of which the level has been raised by the first level shift section; and a second level shift section configured to lower a level of a signal from the high side drive section for input to the control section, the drive method comprising:

outputting, from an error detection section included in the high side drive section, the error detection signal when the semiconductor device is in an error status, and maintaining the output of the error detection signal until the release signal of which the level has been raised by the first level shift section is input;

generating, in the control section, the control signal in accordance with the input signal;

generating, in the control section, the release signal when the error detection signal is input to the control section via the second level shift section:

selecting either the control signal or the release signal and outputting the selected signal to the first level shift section from the control section; and stopping the output of the error detection signal when the release signal of which the level has been raised by the first level shift section is input to the error detection section.

* * * * *